United States Patent [19]
Hsu

[11] Patent Number: 6,100,141
[45] Date of Patent: Aug. 8, 2000

[54] METHOD FOR FORMING ELECTROSTATIC DISCHARGE (ESD) PROTECTION CIRCUIT

[75] Inventor: Chen-Chung Hsu, Taichung, Taiwan

[73] Assignee: United Microelectronics Corp., Hsinchu, Taiwan

[21] Appl. No.: 09/186,305

[22] Filed: Nov. 4, 1998

[51] Int. Cl.[7] .................................................. H01L 21/336
[52] U.S. Cl. .......................... 438/283; 438/279; 438/286; 438/981
[58] Field of Search ..................................... 438/210, 263, 438/264, 279, 283, 286, 301, 303, 305, 306, 530, 595, 594, 981

[56] References Cited

U.S. PATENT DOCUMENTS

| | | | |
|---|---|---|---|
| 5,705,841 | 1/1998 | Yu ........................................... | 257/355 |
| 5,872,378 | 2/1999 | Rose et al. ............................... | 257/355 |
| 5,910,673 | 6/1999 | Hsu et al. ................................. | 257/355 |
| 5,939,753 | 8/1999 | Ma et al. .................................. | 257/339 |

*Primary Examiner*—Charles Bowers
*Assistant Examiner*—Jack Chen
*Attorney, Agent, or Firm*—Hickman Stephens & Coleman LLP

[57] ABSTRACT

A method for forming a dual-thickness gate oxide layer starts with forming and patterning a pad oxide layer and a silicon nitride layer on a substrate. The substrate contains pre-determined regions for accommodating the internal circuit and the ESD protection circuit respectively. A field oxide layer for separating the active regions of the internal circuit and the ESD protection circuit is formed by performing an oxidation process. A thick gate oxide layer is formed on the active region of the ESD protection circuit by oxidation after the pad oxide and the silicon nitride thereover are removed. Similarly, a thin gate oxide layer is formed on the active region of the internal circuit by oxidation after the pad oxide and the silicon nitride thereover are removed. A patterned conducting layer is then formed on the substrate as gates. An implantation process is performed to form the source/drain regions within the region of the internal circuit. Next, spacers that surround the gates are formed on the substrate. And then, another implantation process is performed to form source/drain regions on the substrate within the region of the ESD protection circuit after the thick gate oxide layer is patterned to expose the substrate underneath.

7 Claims, 4 Drawing Sheets

METHOD FOR FORMING ELECTROSTATIC DISCHARGE (ESD) PROTECTION CIRCUIT

BACKGROUND OF THE INVENTION

1. Field of the Invention

This invention relates to a method for fabricating a semiconductor device, and more particularly, to a dual gate oxide process.

2. Description of Related Art

The electrostatic discharge (ESD) has been one of the major causes that damage an integrated circuit in a semiconductor fabrication process. In a deep sub-micron integrated circuit, the ESD even more seriously causes the malfunction of an integrated circuit or even damages the circuit. In order to overcome the problems caused by the ESD, an on-chip ESD protection circuit is added to the pads at the output end and the input end of a complement metal-oxide-semiconductor (CMOS). However, according to the process on the semiconductor fabrication process, the protection of the ESD protection circuit is no longer meets the practical needs.

A conventional ESD protection circuit including a field device transistor is shown in FIG. 1. Referring to FIG. 1, static voltage or over-stress voltage at the input port I/P is discharged through a N-type field device transistor 10 to the ground $V_{SS}$. The input buffer gate 12 and the internal circuit 14 are under the protection of the field device transistor 10.

The cross sectional view of the N-type field device transistor 10 in FIG. 1 is shown in FIG. 2. Referring to FIG. 2, a conventional N-type field device transistor includes a gate 25, a source region 22 and a drain region 23 formed on a substrate 20. There further is a field oxide layer 24 located between the source region 22 and the drain region 23. For an N-type field device transistor, a heavy doped P-type region 26 is formed under the field oxide layer 24. The source region 22 is grounded by connected to a ground $V_{SS}$ through an interconnect 27. In the mean time, the gate 27 and the drain region 23 are connected to the input port I/P and the buffer input gate 12 shown in FIG. 1 through the interconnect 27. The foregoing connection is capable of protecting the internal circuit 14 from an over-stress voltage due to ESD by bypass the over-stress voltage.

In the case than an over-stress voltage appears at the input port I/P, the field device 10 bypasses the over-stress voltage signal by applying the principle of punch-through effect. Theoretically, the punch-through effect of the field device transistor 10 has a faster response to an over-stress voltage before the over-stress voltage causes a junction breakdown on the field effect transistor 10. Hence, the field device transistor 10 can be used as a protection to prevent the breakdown occurs on the low-voltage gate oxide layers in the internal circuit.

Conventionally, a heavy P-type implantation process is used to improve the isolation between devices that also forms a P-type heavy doped region 26 underneath the field oxide 24 of the field device transistor 10. In the presence of the P-type heavy doped region 26, the threshold voltage $V_T$ of the field device transistor 10 is normally as high as about 12 to 14 volts. Consequently, to a gate oxide layer of a thickness below 50 Å, which normally has a breakdown voltage of about 5 to 6 volts, a conventional field device transistor 10 can no longer provide sufficient protection.

In addition, the thickness of the gate oxide layer 24 of a field device transistor 10 is also directly relates to the threshold voltage $V_T$ of the field device transistor 10. That is, the threshold voltage $V_T$ is increased accordingly to the thickness of the field oxide layer of a field device transistor. Therefore, a field device transistor having a filed oxide layer of about 5000 to 8000 Å is not able to protect the devices of an internal circuit that have field oxide layers below 50 Å.

SUMMARY OF THE INVENTION

It is therefore an objective of the present invention to provide a method for forming a field transistor of a low threshold voltage to ensure that the electrostatic discharge (ESD) protection circuit is more protective to the internal circuit.

It is another an objective of the present invention to provide a method that gives a transistor of the ESD protection circuit a thick gate oxide layer. In the mean time, a thin gate oxide layer formed by the method of the invention is for the use of a transistor in the internal circuit.

In order to efficiently bypass an over-stress voltage before it is fed into an internal circuit, the threshold voltage $V_T$ of the field device transistor 10 of an ESD protection circuit shown in FIG. 1 has to be lower than the breakdown voltage of the input buffer gate 12. Normally, the breakdown voltage of the input buffer gate 12 is about 6 volts. On the other hand, the threshold voltage $V_T$ of the field device transistor 10 has to be higher than the voltage required for driving the internal circuit to ensure a proper functionality of the internal circuit. Since a deep-sub-micron semiconductor device normally works under a voltage of about 3.3 volts or below, hence, an ideal threshold voltage of the field device transistor 10 of the ESD protection circuit is about 3.3 to 6 volts.

Speaking of a transistor in the internal circuit, the threshold voltage $V_T$ of a NMOS gate oxide of a thickness less than 200 Å is about 0.7 volts. Since the gate oxide layer of a field device transistor is normally thicker than what of a regular transistor, the threshold voltage $V_T$ of a field device transistor is normally as high as about 12 to 14 volts. Therefore, it is still an objective of the invention to thin the gate oxide layer of a field device transistor to lower the threshold voltage VT of the field device transistor to about 5 volts or below without suppressing the electrical properties of the field device transistor.

In accordance with the foregoing and other objectives of the present invention, the method for forming a dual-thickness gate oxide layer according to the invention starts with forming and patterning a pad oxide layer and a silicon nitride layer on a substrate. The substrate contains predetermined regions for accommodating the internal circuit and the ESD protection circuit respectively. A field oxide layer for separating the active regions of the internal circuit and the ESD protection circuit is formed by performing an oxidation process. A thick gate oxide layer is formed on the active region of the ESD protection circuit by oxidation after the pad oxide and the silicon nitride thereover are removed. Similarly, a thin gate oxide layer is formed on the active region of the internal circuit by oxidation after the pad oxide and the silicon nitride thereover are removed. A patterned conducting layer is then formed on the substrate as gates. An implantation process is performed to form the source/drain regions within the region of the internal circuit. Next, spacers that surround the gates are formed on the substrate. And then, another implantation process is performed to form source/drain regions on the substrate within the region of the ESD protection circuit after the thick gate oxide layer is patterned to expose the substrate underneath.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a new dual gate oxide process to form a thick gate oxide layer for the use of a field device transistor in a electrostatic discharge (ESD) protection circuit, and a thin gate oxide layer for the use of transistors in an internal circuit.

Figure 1:
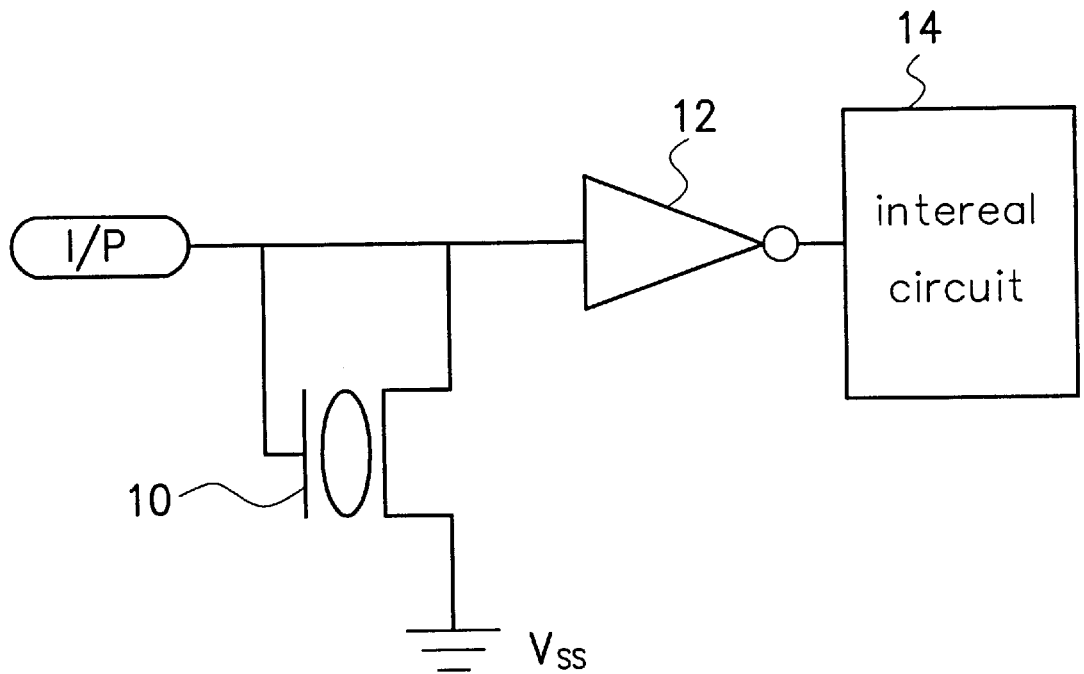
FIG. 1 is a schematic diagram showing a conventional electrostatic discharge protection circuit that contains a field device transistor.
Figure 2:
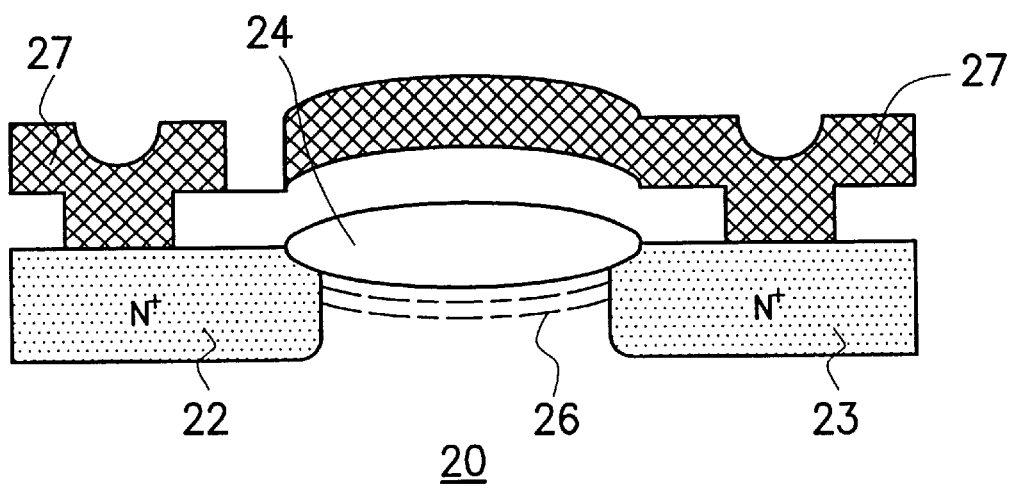
FIG. 2 is a schematic cross-sectional view showing the structure of the field device transistor of the electrostatic discharge protection circuit shown in FIG. 1.

Referring to FIG. 1, in order to efficiently bypass an over-stress voltage before it is fed into an internal circuit, the threshold voltage $V_T$ of the field device transistor 10 of an ESD protection circuit shown in FIG. 1 has to be lower than the breakdown voltage of the input buffer gate 12. Normally, the breakdown voltage of the input buffer gate 12 is about 6 volts. On the other hand, the threshold voltage $V_T$ of the field device transistor 10 has to be higher than the voltage required for driving the internal circuit to ensure a proper functionality of the internal circuit. Since a deep-sub-micron semiconductor device normally works under a voltage of about 3.3 volts or below, hence, an ideal threshold voltage of the field device transistor 10 of the ESD protection circuit is about 3.3 to 6 volts.

Speaking of a transistor in the internal circuit, the threshold voltage $V_T$ of gate oxide layer, which has a thickness of less than 200 Å, in a NMOS device is about 0.7 volts. Since the gate oxide layer of a field device transistor is normally thicker than what of a regular transistor, the threshold voltage $V_T$ of a field device transistor is normally as high as about 12 to 14 volts. Therefore, the invention means to thin the gate oxide layer of a field device transistor to lower the threshold voltage VT down to about 5 volts or lower without suppressing the normal electrical properties of the field device transistor.

FIGS. 3A through 3J are schematic cross-sectional views shown the dual gate oxide process of a preferred embodiment according to the invention.

Figure 3A:
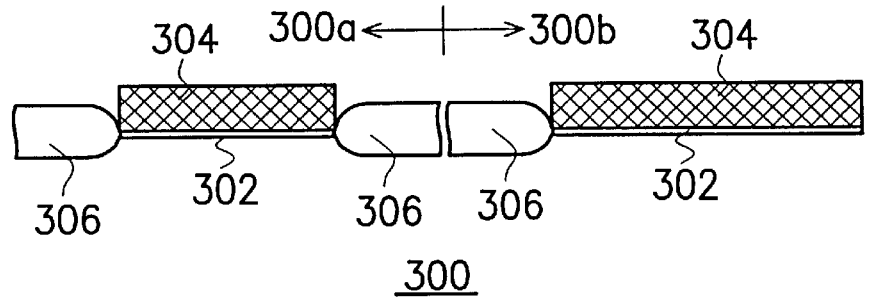
FIGS. 3A through 3J are schematic cross-sectional views showing the structure of a field device transistor in a preferred embodiment fabricated through a method according to the invention.

Referring to FIG. 3A, a pad oxide layer 302 and a silicon nitride ($Si_3O_4$) layer 304 are formed on a provided substrate 300 in sequence, and patterned to expose a portion of the substrate 300. The substrate 300 contains pre-determined regions for the internal circuit and the electrostatic discharge (ESD) circuit respectively. A field oxide layer 306 is formed on the exposed substrate 300 to divide the surface of the substrate 300 into a region 300a as an active region of the internal circuit and another region 300b as an active region of the ESD protection circuit.

Figure 3B:
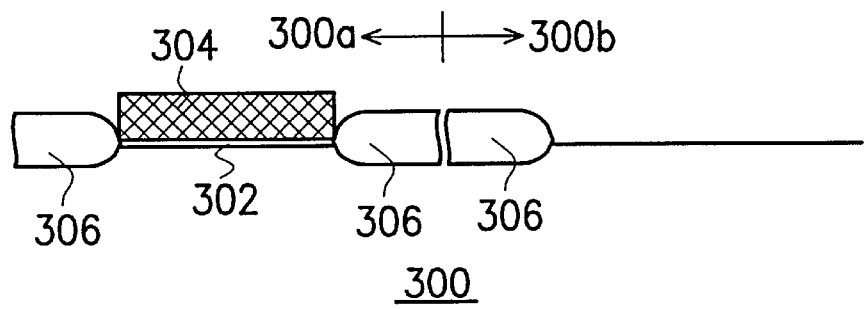

Referring next to FIG. 3B, with a mask (not shown in figure) covering the active region of the internal circuit 300a, the silicon nitride layer 304 and the pad oxide layer 302 over the active region of the ESD protection circuit 300b are removed by performing a dry etching process. The mask is also removed after the dry etching process is done.

Figure 3C:
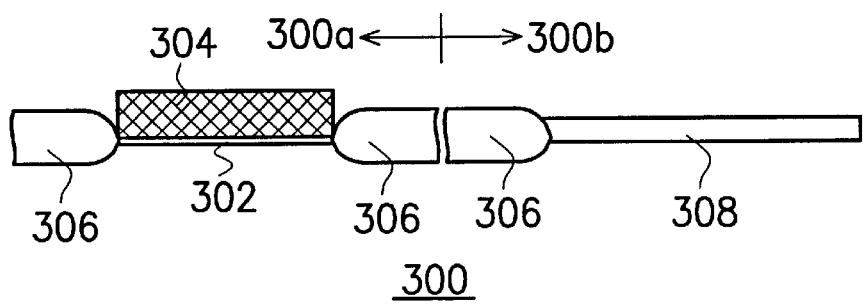

Referring to FIG. 3C, by performing an oxidation process, a thick gate oxide layer 308 is formed on the active region of the ESD protection circuit 300b. In the meantime, the oxidation process thickens the field oxide layer 306 as well, wherein the thickened field oxide layer 306' provides better isolation between active regions 300a and 300b. The thick gate oxide layer 308 is about 1000 to 3000 Å in thickness.

Figure 3D:
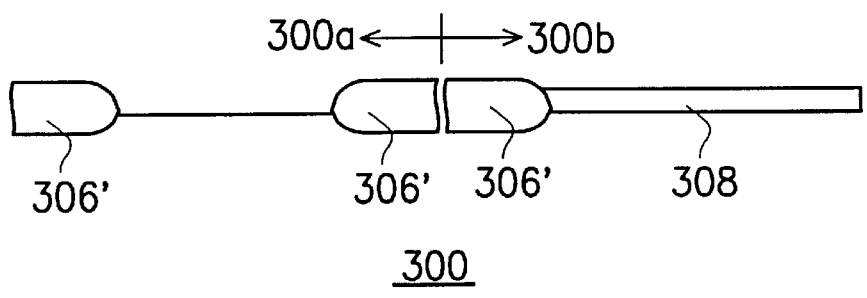

Referring next to FIG. 3D, similarly, with a mask (not shown in figure) covering the active region of the ESD protection circuit 300b, the silicon nitride layer 304 and the pad oxide layer 302 over the active region of the internal circuit 300a are removed by performing a dry etching process. The mask is removed after the dry etching process is done as well.

Figure 3E:
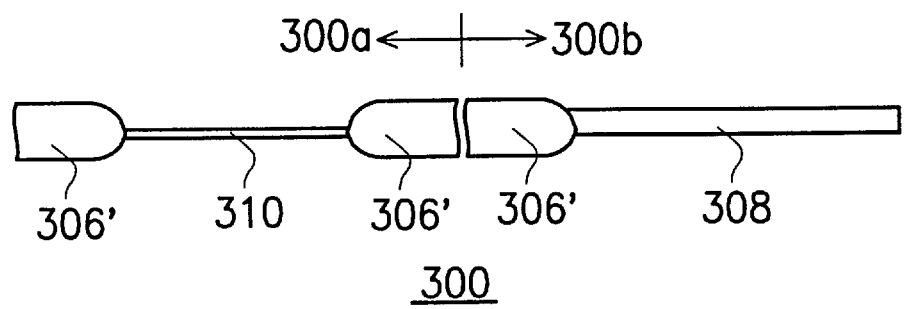

Referring to FIG. 3E, by performing an oxidation process, a thin gate oxide layer 310 is formed on the active region of the internal circuit 300a, wherein the thin gate oxide layer 310 is about 50 to 100 Å in thickness. In the meantime, the oxidation process also thickens the field oxide layer 306' and the thick gate oxide layer 308 as well. However, the increased thickness over the field oxide layer 306' and the thick gate oxide layer 308 is not significant, and is omitted.

Figure 3F:
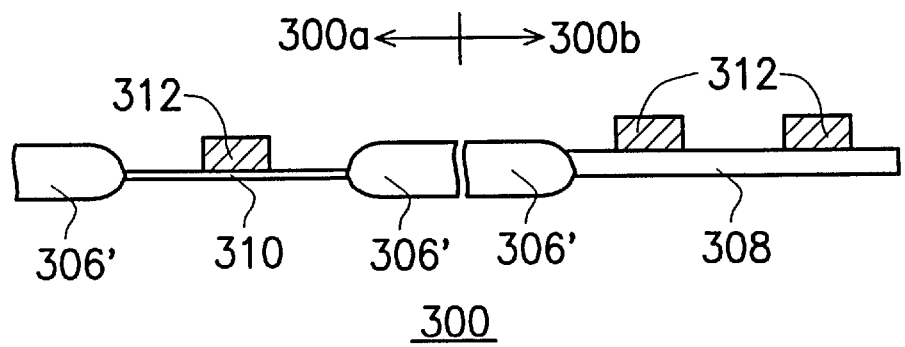

Then, as shown in FIG. 3F, a patterned conducting layer 312, such as polysilicon, is formed on the substrate 300. A portion of the conducting layer is located within the active region of the ESD protection circuit 300b as the gate of a field device transistor. Another portion of the conducting layer 312 is located within the active region of the internal circuit 300a as the gate of a regular transistor.

Figure 3G:
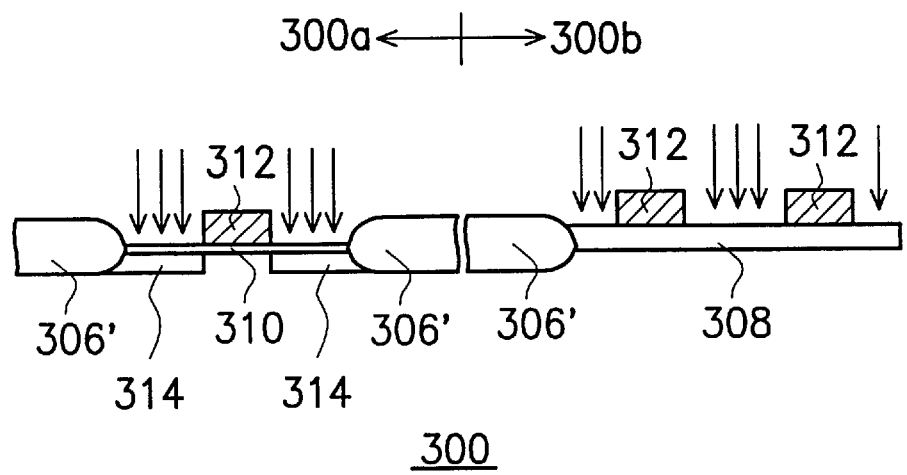

In FIG. 3G, an implantation process is performed to form lightly doped source/drain regions 314 in the substrate 300 within the active region of the internal circuit 300a. Because the implanted dopants can not penetrate through the thick gate oxide layer 308, the active region of the ESD protection circuit 300b is not doped.

Figure 3H:
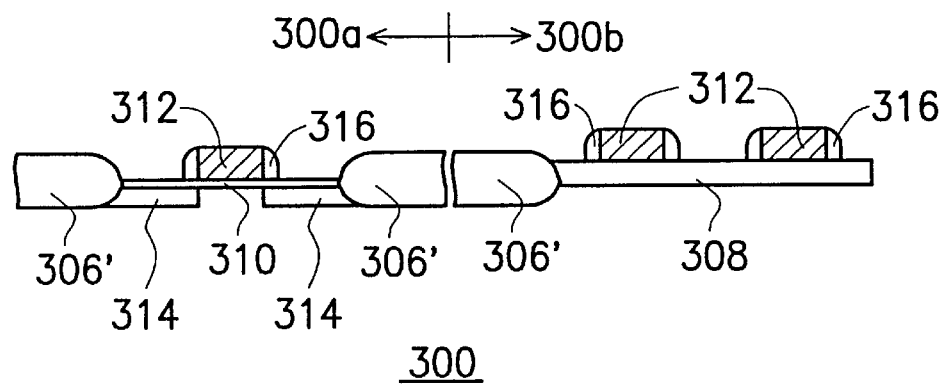

Referring to FIG. 3H, spacers 312 are formed on the sidewalls of the gate 312. The spacers 312 can be oxide or other materials that have the similar property.

Figure 3I:
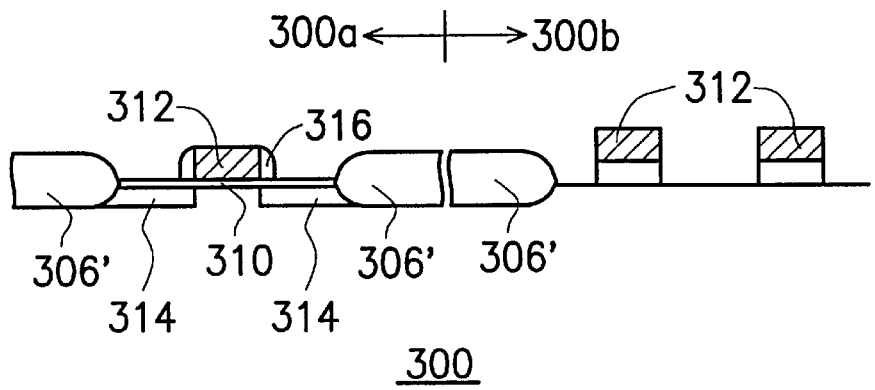

Next, as referring to FIG. 3I, an etching process is performed with using the substrate 300 as an etching end point. The spacers and the exposed thick gate oxide layer 308 in the active region of the ESD protection circuit 300b are removed while the active region of the internal circuit 300a is covered by a mask (not shown in figure). The mask is removed after the etching process is accomplished.

Figure 3J:
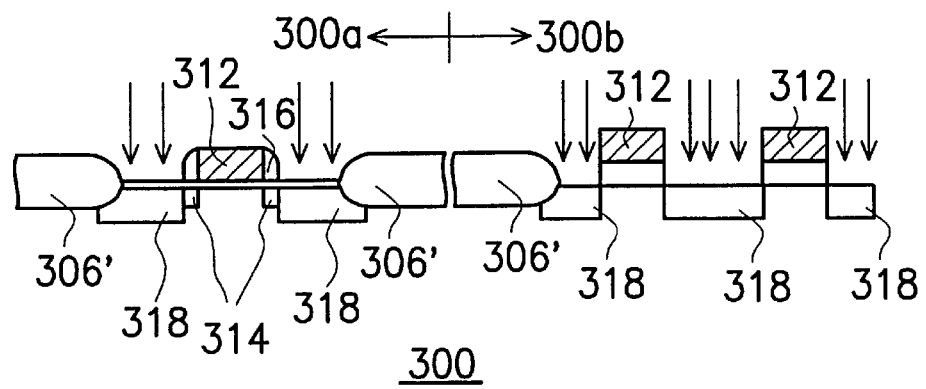

Referring to FIG. 3J, an implantation process is performed to form source/drain regions 318 on the substrate 300.

Referring to the foregoing preferred embodiment according to the invention, the threshold voltage $V_T$ of the field device transistor can be varied by changing the thickness of the first insulator 308. Most of the time, an ideal $V_T$ of a field device transistor is lower than the breakdown voltage of the transistors having thin date oxide layers 310 in the internal circuit. In the meantime, the threshold voltage $V_T$ of the field device transistor has to be higher than the driving voltage $V_{DD}$ required by the internal circuit. Therefore, by keeping the thickness of the thick gate oxide layer 308 within a range of about 1000 to 3000 Å, the threshold voltage $V_T$ can be limited between 3.3 to 5 volts.

The person skilled in the art can implement the dual gate oxide process of the invention in a fabrication process of either a PMOS or a NMOS transistor.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A dual gate oxide process for forming a gate oxide layer of a transistor in an electrostatic discharge (ESD) protection circuit, the dual date oxide process comprising:

provide a substrate consisting of a region of an internal circuit and a region of the ESD protection circuit;

forming a pad oxide layer on the substrate;

forming a silicon nitride layer on the pad oxide layer;

patterning the silicon nitride layer and the pad oxide layer to exposes a portion of the substrate;

performing an oxidation process to form an isolation, wherein the isolation defines an active region of the internal circuit within the region of the internal circuit, and an active region of the ESD protection circuit within the region of the ESD protection circuit;

removing the silicon nitride layer and the pad oxide layer located within the region of the ESD protection circuit;

performing an oxidation process to form a thick gate oxide layer on the substrate within the active region of the ESD protection circuit;

removing the silicon nitride layer and the pad oxide layer located within the region of the internal circuit;

performing an oxidation process to form a thin gate oxide layer on the substrate within the active region of the internal circuit;

forming a patterned conducting layer on the substrate;

performing an implantation process to form a plurality of source/drain regions on the substrate within the region of the internal circuit, wherein the implantation process does not penetrate through the thick gate oxide layer;

forming spacers on the patterned conducting layer;

etching a portion of the thick gate oxide layer and spacers by using the substrate as an etching end point within the region of the ESD protection circuit; and performing an implantation process to form a plurality of sources/drain regions on the substrate within the region of the ESD protection circuit.

2. The dual gate oxide process of claim 1, wherein the step of removing the silicon nitride layer and the pad oxide layer located within the region of the ESD protection circuit comprises:

covering the region of the internal circuit with a first mask;

performing a dry etching process to remove the silicon nitride layer and the pad oxide layer located within the region of the ESD protection circuit; and removing the first mask.

3. The dual gate oxide process of claim 1, wherein the thick gate oxide layer is about 1000 to 3000 Å in thickness.

4. The dual gate oxide process of claim 1, wherein the step of removing the silicon nitride layer and the pad oxide layer located within the region of the internal circuit comprises:

covering the region of the ESD protection circuit with a second mask;

performing a dry etching process to remove the exposed silicon nitride layer and the pad oxide layer located within the region of the internal circuit; and removing the second mask.

5. The dual gate oxide process of claim 1, wherein the thin gate oxide layer is about 50 to 100 Å in thickness.

6. The dual gate oxide process of claim 1, wherein the patterned conducting layer includes polysilicon.

7. The dual gate oxide process of claim 1, wherein the step of etching a portion of the thick gate oxide layer comprises:

covering the region of the internal circuit with a third mask;

etching away the portion of the thick gate oxide layer; and removing the mask.

* * * * *